US012700568B2

(12) United States Patent
Bhowmick et al.

(10) Patent No.: US 12,700,568 B2
(45) Date of Patent: Aug. 4, 2026

(54) SYSTEMS AND METHODS FOR REDUCING REFLECTED POWER AFTER A STATE TRANSITION

(71) Applicant: Lam Research Corporation, Fremont, CA (US)

(72) Inventors: Ranadeep Bhowmick, San Jose, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 30 days.

(21) Appl. No.: 18/840,469

(22) PCT Filed: Feb. 15, 2023

(86) PCT No.: PCT/US2023/013166
§ 371 (c)(1),
(2) Date: Aug. 21, 2024

(87) PCT Pub. No.: WO2023/172384
PCT Pub. Date: Sep. 14, 2023

(65) Prior Publication Data
US 2025/0166969 A1     May 22, 2025

Related U.S. Application Data

(60) Provisional application No. 63/317,433, filed on Mar. 7, 2022.

(51) Int. Cl.
*H01J 37/32*          (2006.01)
(52) U.S. Cl.
CPC .............................. *H01J 37/32174* (2013.01)

(58) Field of Classification Search
CPC ................................................. H01J 37/32174
See application file for complete search history.

(56) References Cited

U.S. PATENT DOCUMENTS

| | | | |
|---|---|---|---|
| 8,952,765 B2 * | 2/2015 | Fisk, II ................ | H03B 5/1237 |
| | | | 330/296 |
| 9,536,749 B2 | 1/2017 | Marakhtanov et al. | |
| 9,741,539 B2 | 8/2017 | Kawasaki et al. | |
| 2014/0306754 A1 | 10/2014 | Coumou et al. | |

FOREIGN PATENT DOCUMENTS

WO     WO 2022-010686 A1     1/2022

OTHER PUBLICATIONS

ISR & WO PCT/US2023/013166, dated Jun. 12, 2023, 10 pages.

* cited by examiner

*Primary Examiner* — Henry Luong
(74) *Attorney, Agent, or Firm* — Polygon IP, LLP

(57) ABSTRACT

A method for reducing reflected power associated with a high frequency (HF) radio frequency (RF) generator after a transition state is described. The method includes controlling the HF RF generator to divide a state of an HF RF signal into a plurality of sub-states. The plurality of sub-states include a first sub-state and a second sub-state. The method further includes controlling the HF RF generator to apply a first reference high frequency value during the first sub-state and a second reference high frequency value during the second sub-state. The method includes applying a first set of HF offset values from the first reference high frequency value during the first sub-state and applying a second set of HF offset values from the second reference high frequency value during the second sub-state.

14 Claims, 4 Drawing Sheets

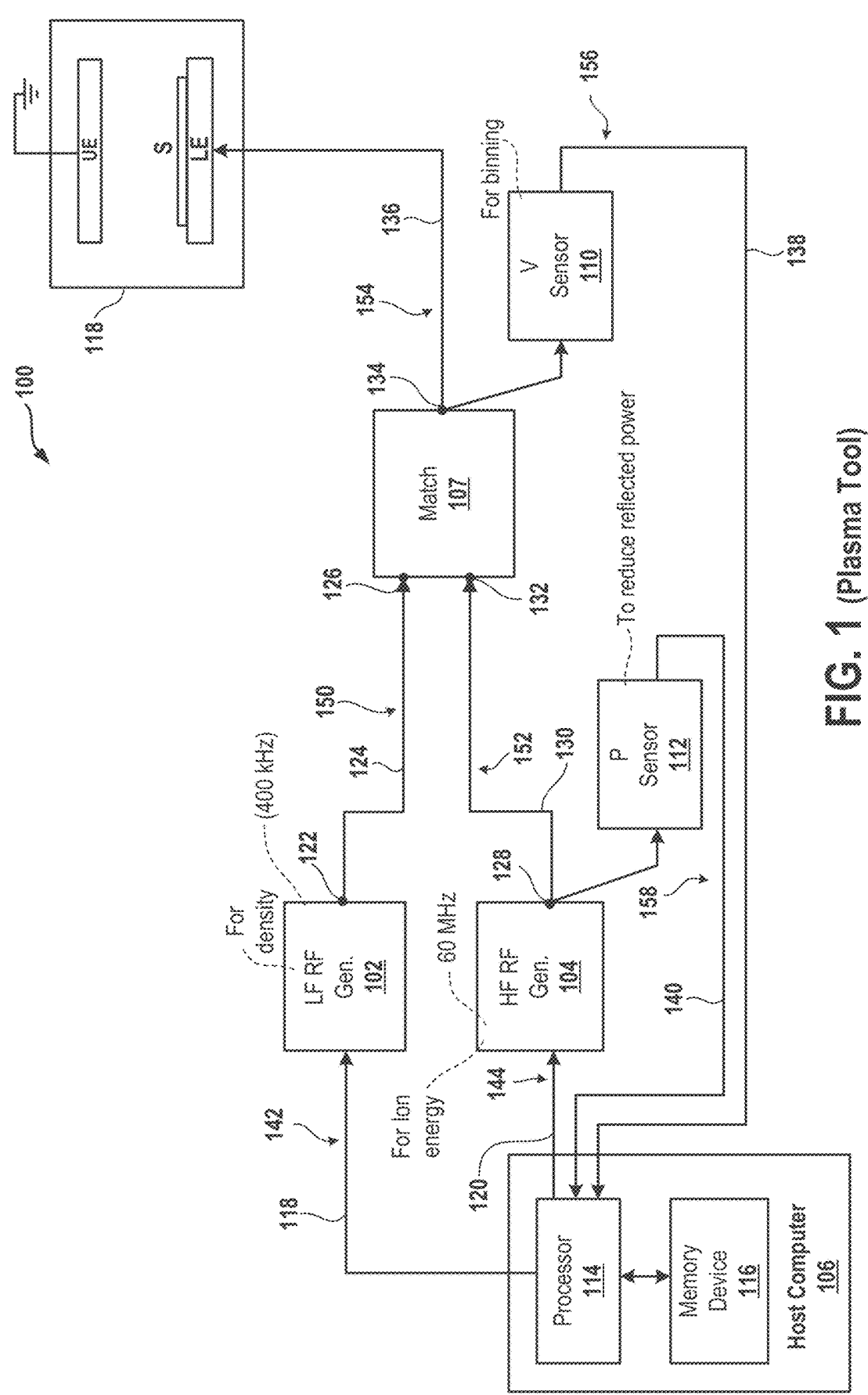
FIG. 1 (Plasma Tool)

FIG. 2B (Break S3y into S3ay & S3ly)

SYSTEMS AND METHODS FOR REDUCING REFLECTED POWER AFTER A STATE TRANSITION

CLAIM OF PRIORITY

This application is a national stage filing of and claims priority, under 35 U.S.C. § 371, to PCT/US23/13166, filed on Feb. 15, 2023 and titled "SYSTEMS AND METHODS FOR REDUCING REFLECTED POWER AFTER A STATE TRANSITION", which claims the benefit of and priority, under 35 U.S.C. § 119(e), to U.S. Provisional Patent Application No. 63/317,433, filed on Mar. 7, 2022, and titled "SYSTEMS AND METHODS FOR REDUCING REFLECTED POWER AFTER A STATE TRANSITION", all of which are incorporated by reference herein in their entirety.

FIELD

The embodiments described in the present disclosure relate to systems and methods for reducing reflected power after a state transition.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes a radio frequency (RF) generator, a match, and a plasma reactor. The RF generator is coupled via the match to the plasma reactor. A semiconductor wafer is placed in the plasma reactor for processing. The RF generator generates an RF signal, which is supplied via the match to the plasma reactor. In addition to the RF signal, a process gas is provided to the plasma reactor to process the semiconductor wafer. However, power is reflected from the plasma reactor towards the HF RF generator. This reduces efficiency in processing of the semiconductor wafer.

It is in this context that embodiments described in the present disclosure arise.

SUMMARY

Embodiments of the disclosure provide systems and methods for reflected power after a state transition. It should be appreciated that the present embodiments can be implemented in numerous ways, e.g., a process, an apparatus, a system, a piece of hardware, or a method on a computer-readable medium. Several embodiments are described below.

In one embodiment, a method for reducing reflected power associated with a high frequency (HF) radio frequency (RF) generator after a transition state is described. The method includes controlling the HF RF generator to divide a state of an HF RF signal into a plurality of sub-states. The plurality of sub-states includes a first sub-state and a second sub-state. The method further includes controlling the HF RF generator to apply a first reference high frequency value during the first sub-state and a second reference high frequency value during the second sub-state. The method includes applying a first set of HF offset values from the first reference high frequency value during the first sub-state and applying a second set of HF offset values from the second reference high frequency value during the second sub-state.

In an embodiment, a controller for reducing reflected power associated with an HF RF generator after a transition state is described. The controller includes a processor that controls the HF RF generator to divide a state of an HF RF signal into a plurality of sub-states. The plurality of sub-states includes a first sub-state and a second sub-state. The processor further controls the HF RF generator to apply a first reference high frequency value during the first sub-state and a second reference high frequency value during the second sub-state. The processor applies a first set of HF offset values from the first reference high frequency value during the first sub-state. The processor applies a second set of HF offset values from the second reference high frequency value during the second sub-state. The controller includes a memory device coupled to the processor.

In one embodiment, a system for reducing reflected power associated with an HF RF generator after a transition state is described. The system includes a low frequency (LF) RF generator that generates an LF RF signal. The HF RF generator generates an HF RF signal. The system includes a match coupled to the LF RF generator and the HF RF generator. The system includes a controller coupled to the LF RF generator and the HF RF generator. The controller controls the HF RF generator to divide a state of the HF RF signal into a plurality of sub-states. The plurality of sub-states includes a first sub-state and a second sub-state. The controller controls the HF RF generator to apply a first reference high frequency value during the first sub-state and a second reference high frequency value during the second sub-state. The controller applies a first set of HF offset values from the first reference high frequency value during the first sub-state. The controller applies a second set of HF offset values from the second reference high frequency value during the second sub-state.

Some advantages of the herein described systems and methods include reducing reflected power after the state transition. The state transition creates a disturbance in plasma impedance. As a result of the disturbance, a greater amount of power is reflected towards an HF RF generator immediately after the state transition. The greater amount of power reflected is sometimes referred to herein as a power glitch. To reduce the amount of reflected power in an accurate and detailed manner, a state that immediately follows the state transition is divided into a pre-determined number of sub-states. The division accounts for impedance changes that occur over a period of the state. For each sub-state, a reference high frequency value and multiple HF offsets are determined to reduce power that is reflected towards the HF RF generator after the state transition. By dividing the state into the pre-determined number of states and by applying the reference high frequency value and the HF offsets to each of the sub-states separately, power that is reflected towards the HF RF generator is reduced in the accurate manner. For example, the sub-states include a first sub-state and a second sub-state. In the example, by determining a reference high frequency value for the second sub-state, the power reflected towards the HF RF generator is accounted for in a more accurate manner.

Some other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

FIG. 1 is a diagram of an embodiment of a plasma system to illustrate use of a low frequency (LF) radio frequency (RF) generator and a high frequency (HF) RF generator.

FIG. 2B is a graph to illustrate multi-state pulsing of RF signals generated by the LF RF and HF RF generators.

DETAILED DESCRIPTION

Figure 2A:
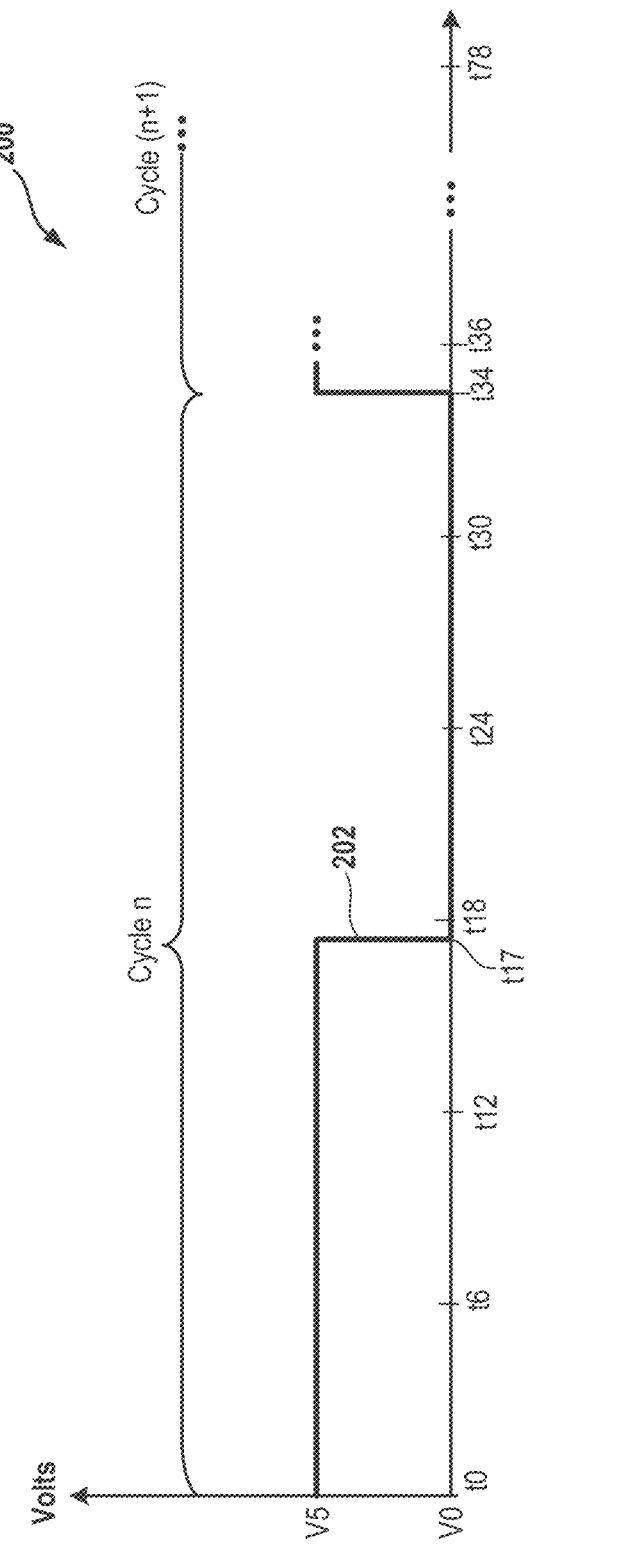
FIG. 2A is a graph to illustrate a clock signal.

The following embodiments describe systems and methods for reducing high frequency (HF) radio frequency (RF) reflected power after a state transition in a detailed and accurate manner. It will be apparent that the present embodiments may be practiced without some or all of these specific details. In other instances, well known process operations have not been described in detail in order not to unnecessarily obscure the present embodiments.

FIG. 1 is a diagram of an embodiment of a plasma system 100 to illustrate use of a low frequency (LF) RF generator 102 and an HF RF generator 104. The system 100 includes the LF RF generator 102, the HF RF generator 104, a host computer 106, a match 107, and a plasma chamber 108. The plasma system 100 further includes a voltage (V) sensor 110 and a power (P) sensor 112.

As an example, the LF RF generator 102 has a frequency of operation of 400 kilohertz (kHz), or 2 megahertz (MHz). Also, as an example, the HF RF generator 104 has a frequency of operation of 27 MHz or 60 MHz. Examples of the host computer 106 include a desktop, a laptop, a tablet, a controller, and a smart phone. An example of the match 107 is an impedance matching circuit or an impedance match or a match circuit or an impedance matching network. To illustrate, the match 107 includes a first branch circuit and a second branch circuit. Each branch circuit includes one or more match network elements. Examples of match network elements include capacitors, inductors, and resistors. An example of the plasma chamber 108 is a capacitively coupled plasma (CCP) chamber.

The host computer 106 includes a processor 114 and a memory device 116. Examples of the processor 114 include a central processing unit (CPU), an application specific integrated circuit (ASIC), and a programmable logic device (PLD). Examples of the memory device 116 include a read-only memory and a random access memory.

The plasma chamber 108 includes a lower electrode LE and an upper electrode UE. A gap is formed between the lower electrode LE and the upper electrode UE and a substrate S is placed within the gap on a top surface of the lower electrode LE for processing. An example of the substrate S includes a semiconductor wafer on which an integrated circuit is fabricated.

The processor 114 is coupled to the memory device 116. The processor 114 is coupled via a transfer cable 118 to the LF RF generator 102 and via a transfer cable 120 to the HF RF generator 104. An example of a transfer cable includes an electric cable that transfers data in a parallel manner or in a serial manner or using a universal serial bus (USB) protocol. The LF RF generator 102 has an output 122 that is coupled via an RF cable 124 to an input 126 of the match 107. Similarly, the HF RF generator 104 has an output 128 that is coupled via an RF cable 130 to an input 132 of the match 107. The match 107 has an output 134, which is coupled via an RF transmission line 136 to the lower electrode LE. The first branch circuit of the match 107 is coupled between the input 126 and the output 134, and the second branch circuit of the match 107 is coupled between the input 132 and the output 134. The upper electrode UE is coupled to a ground potential.

The V sensor 110 is coupled via a transfer cable 138 to the processor 114 and the P sensor 112 is coupled via a transfer cable 140 to the processor 114. The V sensor 110 is coupled to the output 134 of the match 134. Also, the P sensor 112 is coupled to the output 128 of the HF RF generator 104.

The processor 114 generates a recipe signal 142, which includes a low frequency and one or more power levels of an RF signal 150 to be generated by the LF RF generator 102. As an example, the low frequency is equal to the frequency of operation of the LF RF generator 102. The processor 114 sends the recipe signal 142 via the transfer cable 118 to the LF RF generator 102. Also, the processor 114 generates a recipe signal 144, which includes a high frequency and one or more power levels of an RF signal 152 to be generated by the HF RF generator 104. As an example, the high frequency is equal to the frequency of operation of the HF RF generator 104. The processor 114 sends the recipe signal 144 via the transfer cable 120 to the HF RF generator 104.

Upon receiving the recipe signal 142, the LF RF generator 102 generates the RF signal 150 having the low frequency and the one or more power levels indicated within the recipe signal 142. The LF RF generator 102 sends the RF signal 150 via the output 122, the RF cable 124, and the input 126 to the match 107. Similarly, upon receiving the recipe signal 144, the HF RF generator 104 generates the RF signal 152 having the high frequency and the one or more power levels indicated within the recipe signal 144. The HF RF generator 104 sends the RF signal 152 via the output 128, the RF cable 130, and the input 132 to the match 107.

Upon receiving the RF signal 150, the first branch circuit of the match 107 matches an impedance of a load coupled to the output 134 with an impedance of a source coupled to the input 126 to modify an impedance of the RF signal 150 to provide a first modified RF signal. An example of the load coupled to the output 134 includes the RF transmission line 136 and the plasma chamber 108. An example of the source coupled to the input 126 includes the RF cable 124 and the LF RF generator 102. Similarly, upon receiving the RF signal 152, the second branch circuit of the match 107 matches an impedance of the load coupled to the output 134 of the match 107 with an impedance of a source coupled to the input 132 of the match 107 to modify an impedance of the RF signal 152 to provide a second modified RF signal.

The match 107 combines, such as adds, the first and second modified RF signals to output a modified RF signal 154 at the output 134. The modified RF signal 154 is sent from the output 134 via the RF transmission line 136 to the lower electrode LE. When one or more process gases, such as a fluorine-containing gas, an oxygen-containing gas, a nitrogen-containing gas, etc., are supplied to the gap between the lower electrode LE and the upper electrode UE, in addition to the modified RF signal 154, plasma is stricken or maintained within the gap. The plasma processes the substrate S. Examples of processing the substrate S include etching features within the substrate S, depositing materials on the substrate S, and cleaning the substrate S.

While the substrate S is being processed, the V sensor 110 measures a voltage at the output 134 to output a voltage signal 156 and sends the voltage signal 156 via the transfer cable 138 to the processor 114. Similarly, while the substrate S is being processed, the P sensor 112 measures power, such as delivered power or reflected power, at the output 134 to output a power signal 158 and sends the power signal 158 via the transfer cable 140 to the processor 114.

In an embodiment, the V sensor 110 is coupled at any point on the RF transmission line 136.

In one embodiment, the P sensor 112 is coupled at any point on the RF cable 130.

FIG. 2A is an embodiment of a graph 200 to illustrate a clock signal 202. As an example, the clock signal 202 is generated by the processor 114 (FIG. 1). An x-axis of the graph 200 plots time t ranging from a time t0 to a time t36. A y-axis of the graph 200 plots a voltage of the clock signal 202. The clock signal 202 transitions periodically between a logic level 1 and a logic level 0. The logic level 1 represents V5 volts and the logic level 0 represents V0 volts. The value V5 is greater than the value V0.

The clock signal 202 transitions from the logic level 0 to the logic level 1 at the time t0 and remains at the logic level 1 from the time t0 to the time t17. At the time t17, the clock signal 202 transitions from the logic level 1 to the logic level 0, and remains at the logic level 0 from the time t17 to the time t34. The transitions between the logic levels 1 and 0 repeat from the time t34 to a time t78. The clock signal 202 has a cycle n from the time t0 to the time t34 and a consecutively following cycle (n+1) from the time t34 to the time t78, where n is a positive integer.

The processor 114 sends the clock signal 202 via the transfer cable 118 to the LF RF generator 102 and via the transfer cable 120 to the HF RF generator 104 to operate the generators 102 and 104 in synchronization with the clock signal 202. For example, after receiving the clock signal 202, the LF RF generator 102 generates a set of states of the RF signal 150 during the cycle n and repeats the set of states during the cycle (n+1). Similarly, the HF RF generator 104 generates a set of states of the RF signal 152 during the cycle n and repeats the set of states during the cycle (n+1).

FIG. 2B is an embodiment of a graph 210 to illustrate multi-state pulsing of each of the RF signals 150 and 152 (FIG. 1). The graph 210 plots an envelope 212 having power levels of the RF signal 150 versus the time t and an envelope 214 having power levels of the RF signal 152 versus the time t. The power levels of the RF signals 150 and 152 are plotted on a y-axis and the time t is plotted on an x-axis. The x-axis of the graph 210 is the same as the x-axis of the graph 200 (FIG. 2A). The y-axis of the graph 210 has power levels ranging from P0 to P12. The power levels plotted on the y-axis of the graph 120 increase from P0 to P12. As an example, the power level P0 is zero. Examples of an envelope of an RF signal include a peak-to-peak amplitude of the RF signal and a zero-to-peak amplitude of the RF signal.

During the cycle n, the envelope 212 has the power level P12 from the time t0 to the time t4 and transitions at the time t4 from the power level P12 to the power level P0. Further, during the cycle n, the envelope 212 achieves the power level P0 at the time t6 and remains at the power level P0 from the time t6 to the time t22. During the cycle n, the envelope 212 transitions at the time t22 from the power level P0 to the power level P5 and achieves the power level P5 at the time t23. Moreover, during the cycle n, the envelope 212 remains at the power level P5 from the time t23 to the time t27, and transitions at the time t27 from the power level P5 to the power level P8. During the cycle n, the envelope 212 achieves the power level P8 at the time t28 and remains at the power level P8 from the time t28 to the time t33. Also, during the cycle n, the envelope 212 transitions at the time t33 from the power level P8 to the power level P12, and achieves the power level P12 at the time t34. In this manner, during each cycle of the clock signal 202 (FIG. 2A), the power levels P12, P0, P5, and P8 of the envelope 212 repeat.

Similarly, during the cycle n, the envelope 214 has the power level P4 from the time t0 to the time t4 and transitions at the time t4 from the power level P4 to the power level P0. Further, during the cycle n, the envelope 214 achieves the power level P0 at the time t6 and remains at the power level P0 from the time t6 to the time t22. During the cycle n, the envelope 214 transitions at the time t22 from the power level P0 to the power level P2 and achieves the power level P2 at the time t23. Moreover, during the cycle n, the envelope 214 remains at the power level P2 from the time t23 to the time t27, and transitions at the time t27 from the power level P2 to the power level P1. During the cycle n, the envelope 214 achieves the power level P1 at the time t28 and remains at the power level P1 from the time t28 to the time t33. Also, during the cycle n, the envelope 214 transitions at the time t33 from the power level P1 to the power level P4, and achieves the power level P4 at the time t34. In this manner, during each cycle of the clock signal 202 (FIG. 2A), the power levels P4, P0, P2, and P1 of the envelope 214 repeat.

Each power level of an RF signal is a steady state of the RF signal. For example, the power level P12 is a steady state S1x of the RF signal 150, the power level P0 is a steady state S2x of the RF signal 150, the power level P5 is a steady state S3x of the RF signal 150, and the power level P8 is a steady state S4x of the RF signal 150. Similarly, as another example, the power level P4 is a steady state S1y of the RF signal 152, the power level P0 is a steady state S2y of the RF signal 152, the power level P2 is a steady state S3y of the RF signal 152, and the power level P1 is a steady state S4y of the RF signal 152.

The transition from the steady state S2x to the steady state S3x creates a power glitch in delivered power associated with the HF RF generator 104 (FIG. 1). For example, there is an increase in the high frequency reflected power created by the transition from the steady state S2x to the steady state S3x. The high frequency reflected power is power reflected from the plasma chamber 108 via the RF transmission line 136, the match 107, and the RF cable 130 towards the HF RF generator 104. The delivered power of the HF RF generator 104 is a difference between supplied power of the HF RF generator 104 and the high frequency reflected power. The supplied power of the HF RF generator 104 is power of the RF signal 152 and the power is supplied from the HF RF generator 104 via the RF cable 130, the match 107, and the RF transmission line 136 to the plasma chamber 108.

A transition from the steady state S2y to the steady state S3y is referred to herein as a transition state S23y or a state transition. As an example, during a transition state, power values of an envelope of an RF signal change more frequently compared to change in power values of the envelope of the RF signal during a steady state. As another example, during a steady state, a slope of a power level of an RF signal is substantially zero or zero. As yet another example, power values of an envelope of the RF signal during a steady state are within a pre-determined range and power values of the envelope of the RF signal during a transition state are outside the pre-determined range. As another example, power values of the steady state S2y are within a first pre-determined range, power values of the steady state S3y are within a second pre-determined range, and power values of the transition state S23y are outside the first and second pre-determined ranges. To illustrate, power values of the transition state S23y are greater than power values of the steady state S2y and less than power values of the steady state S3y.

Figure 2C:
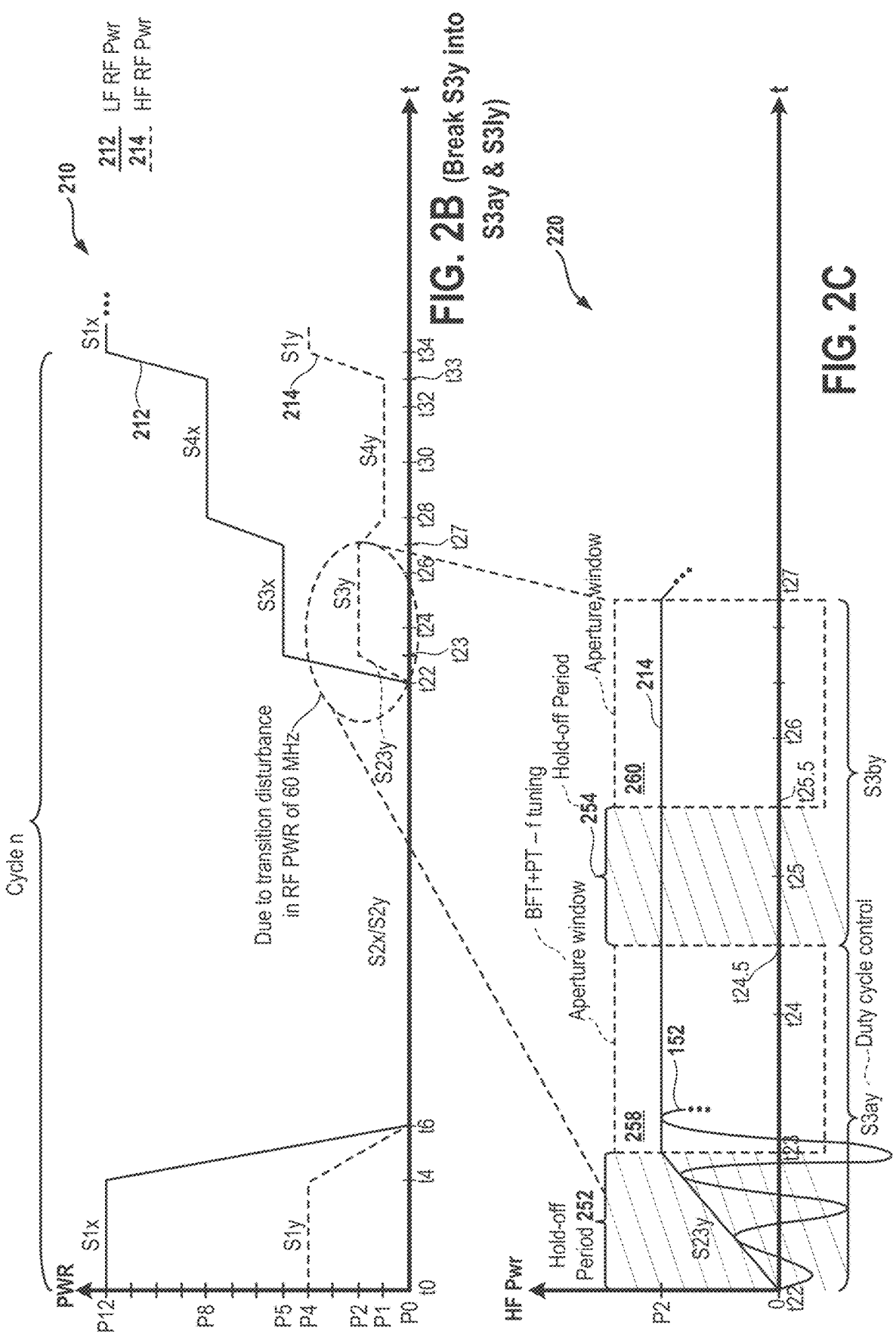
FIG. 2C is a graph to illustrate a method for reducing a power glitch after a state transition.

FIG. 2C is an embodiment of a graph 220 to illustrate a method for reducing the power glitch. The graph 220 includes the envelope 214 versus the time t. The graph 220 plots power levels of the envelope 214 of the RF signal 152 on a y-axis and the time t on the x-axis. The processor 114 identifies the transition state S23y as having values outside a pre-determined range, such as the first pre-determined range or the second pre-determined range, and further identifies the steady state S3y as a state immediately following the transition state S23y and having values within the pre-determined range.

The processor 114 controls the HF RF generator 104 to divide the steady state S3y and the transition state S23y into a pre-determined number of sub-states, such as a sub-state S3ay and a sub-state S3by. For example, the processor 114 generates the recipe signal 144 (FIG. 1) including information regarding the two sub-states S3ay and S3by, such as, a first power level of the sub-state S3ay, a second power level of the sub-state S3by, a first duty cycle of occurrence of the sub-state S3ay, and a second duty cycle of occurrence of the sub-state S3by. Moreover, in the example, the information regarding the two sub-states S3ay and S3by includes a first reference high frequency value HF0 for the sub-state S3ay and a second reference high frequency value HF0' for the sub-state S3by, a first set of HF offset values for the sub-state S3ay to be applied to the first high reference frequency value, and a second set of HF offset values for the sub-state S3by to be applied to the second high reference frequency value. To illustrate, the value HF0 is different from, such as greater than or less than, the value HF0'. As another illustration, the value HF0 is equal to the value HF0'. In the example, the information regarding the two sub-states S3ay and S3by includes the first duty cycle for which the first high reference frequency value HF0 and the first set of HF offset values are to be applied by the HF RF generator 104. Further, in the example, the information regarding the two sub-states S3ay and S3by includes the second duty cycle for which the second high reference frequency value HF0' and the second set of HF offset values are to be applied by the HF RF generator 104. In the example, the first duty cycle is a time period for occurrence of the sub-state S3ay and the second duty cycle is a time period for occurrence of the sub-state S3by. Also, in the example, the first power level of the sub-state S3ay is equal to the second power level of the sub-state S3by.

Further, in the example, the processor 114 accesses, such as reads, the first duty cycle, the second duty cycle, the first power level, the second power level, the first reference high frequency value HF0 and the first set of HF offset values, and the second reference high frequency value HF0' and the second set of HF offset values from the memory device 116. In the example, a correspondence, such as a one-to-one relationship, between the first reference high frequency value and the first set of HF offset values is stored in the memory device 116. Also, in the example, a correspondence, such as a one-to-one relationship, between the second reference high frequency value and the second set of HF offset values is stored in the memory device 116.

Continuing with the example, in response to receiving the recipe signal 144, the HF RF generator 104 generates, during the first duty cycle of each cycle n, (n+1), and so on of the clock signal 202 (FIG. 2), the RF signal 152 having the first reference high frequency value HF0 and the first set of HF offset values from the first reference high frequency value HF0. Also, in the example, in response to receiving the recipe signal 144, the HF RF generator 104 generates, during the second duty cycle of each cycle n, (n+1), and so on of the clock signal 202, the RF signal 152 having the second reference high frequency value HF0' and the second set of HF offset values from the second reference high frequency value HF0'. In the example, in response to receiving the recipe signal 144, the HF RF generator 104 generates the RF signal 152 having the same power level during the sub-states S3ax and S3ay.

It should be noted that a combination of the steady state S3y and the transition state S23y is sometimes referred to herein as a state. For example, the state includes the transition from the steady state S2y to the steady state S3y and includes the steady state S3y. As another example, when the transition from the steady state S2y to the steady state S3y is vertical or substantially vertical, the state includes the steady state S3y and the transition state S23y.

An example of a duty cycle is a time period or a time interval or a time window. To illustrate, the first duty cycle is 100 microseconds and the second duty cycle is 100 microseconds. As another illustration, the first duty cycle is less than or greater than the second duty cycle. To further illustrate, the first duty cycle is a time interval from the time t22 to the time t24.5 and the second duty cycle is a time interval from the time t24.5 to the time t27. Also, as an example, the pre-determined number of sub-states is received from a user via an input device that is coupled to the processor 114. Examples of the input device include a keyboard, a stylus, a keypad, and a mouse. Further, as an example, the first and second duty cycles are received from the user via the input device. As another example, the first and second duty cycles are empirically determined by the processor 114 to reduce the power reflected towards the HF RF generator 104, and stored in the memory device 116 for access by the processor 114.

Also, as an example, the first high reference frequency value HF0 and the first set of HF offset values are empirically determined. To illustrate, the processor 114 operates the HF RF generator 104 at multiple reference high frequency values during a bin 0, which is further described below, and obtains values of the high frequency reflected power from the P sensor 112 (FIG. 1) for each of the reference high frequency values. In the illustration, the processor 114 calculates a statistical value, such as an average value or a median value, from the values of the high frequency reflected power for each of the reference high frequency values. In the illustration, the processor 114 determines that the reference high frequency value HF0 among the reference high frequency values during the bin 0 is one for which a statistical value of high frequency reflected power is minimum among all the statistical values of the high frequency reflected power. Further, in the illustration, the bin 0 occurs during a cycle (n-m) of the clock signal 202 (FIG. 2), where m is an integer less than n.

As another illustration, any of the first set of HF offset values is empirically determined in the same manner in which the first high reference frequency value HF0 except that the any of the first set of HF offset values is determined for a corresponding bin of the cycle (n-m). To further illustrate, the processor 114 operates the HF RF generator 104 at multiple HF offset values during a bin 1, which is further described below, and obtains values of the high frequency reflected power from the P sensor 112 for each of the HF offset values. Also, in the further illustration, the bin 1 occurs during the cycle (n-m) of the clock signal 202. In the further illustration, each of the HF offset values are offsets associated with, such as subtractions from or additions to, the reference high frequency value HF0. In the further illustration, the processor 114 calculates a statistical value, such as an average value or a median value, from the values of the high frequency reflected power for each of the HF offset values. In the further illustration, the processor 114 determines that one of the HF offset values among the HF offset values during the bin 1 is one for which a statistical value of high frequency reflected power is minimum among all the statistical values of the high frequency reflected power. In the further illustration, the one of the HF offset values is stored in the memory device 116 as one of the first set of HF offset values for access by the processor 114 to control the HF RF generator 104 during the bin 1 of the cycles n, (n+1) and so on.

Also, in the further illustration, the first set of HF offset values are determined by the processor 114 to have an inverse relationship or a substantially inverse relationship with the voltage signal 156. In the further illustration, the voltage signal 156 has positive values during a time period between the times t22 and t24.5 and the HF offsets HF(−2), HF(−3), HF(−4), HF(−3) and HF(−2) for the bins 1 through 5 are offset in a negative direction with respect to the reference high frequency value HF0. The HF offsets HF(−2), HF(−3), HF(−4) and HF(−2) are subtracted from the reference high frequency value HF0. In the further illustration, the voltage signal 156 has negative values during a time period between the times t24.5 and t27 and the HF offsets HF(1), HF(2), HF(3), HF(4), HF(2), and HF(1) for the bins 7 through 12 are offset in a positive direction with respect to the reference high frequency value HF0. The HF offsets HF(1), HF(2), HF(3), HF(4) are added to the reference high frequency value HF0.

Further, as an example, the second high reference frequency value HF0' and the second set of HF offset values are empirically determined. To illustrate, the processor 114 operates the HF RF generator 104 at multiple reference high frequency values during a bin 0', which is further described below, and obtains values of the high frequency reflected power from the P sensor 112 for each of the reference high frequency values. In the illustration, the processor 114 calculates a statistical value, such as an average value or a median value, from the values of the high frequency reflected power for each of the reference high frequency values. In the illustration, the processor 114 determines that the reference high frequency value HF0' among the reference high frequency values during the bin 0' is one for which a statistical value of high frequency reflected power is minimum among all the statistical values of the high frequency reflected power. Further, in the illustration, the bin 0' occurs during the cycle (n-m) of the clock signal 202.

As another illustration, any of the second set of HF offset values is empirically determined in the same manner in which the second high reference frequency value HF0' except that the any of the second set of HF offset values is determined for a corresponding bin of the cycle (n-m). To further illustrate, the processor 114 operates the HF RF generator 104 at multiple HF offset values during a bin 1', which is further described below, and obtains values of the high frequency reflected power from the P sensor 112 for each of the HF offset values. In the further illustration, the bin 1' occurs during the cycle (n-m) of the clock signal 202. Also, in the further illustration, each of the HF offset values are offsets, such as subtractions from or additions to, the reference high frequency value HF0'. In the further illustration, the processor 114 calculates a statistical value, such as an average value or a median value, from the values of the high frequency reflected power for each of the HF offset values. In the further illustration, the processor 114 determines that of the HF offset values among the HF offset values during the bin 1' is one for which a statistical value of high frequency reflected power is minimum among all the statistical values of the high frequency reflected power. In the further illustration, the one of the HF offset values is stored in the memory device 116 as one of the second set of HF offset values for access by the processor 114 to control the HF RF generator 104 during the bin 1' of the cycles n, (n+1) and so on.

Also, in the further illustration, the second set of HF offset values are determined by the processor 114 to have an inverse relationship or a substantially inverse relationship with the voltage signal 156. In the further illustration, the HF offsets HF(−1), HF(−2), HF(−3), HF(−2), and HF0 for the bins 1' through 5' are offset in a negative direction with respect to the reference high frequency value HF0'. The HF offsets HF(−2), HF(−3), HF(−2), and HF0 are subtracted from the reference high frequency value HF0'. In the further illustration, the HF offsets HF(2), HF(3), HF(4), HF(5), HF(4), and HF(1) for the bins 7' through 12' are offset in a positive direction with respect to the reference high frequency value HF0'. The HF offsets HF(1), HF(2), HF(3), HF(4), and HF(5) are added to the reference high frequency value HF0'.

In an embodiment, the information regarding the two sub-states S3ay and S3by includes a hold-off period for each sub-state. For example, the information regarding the two sub-states includes a hold-off period 252 during the sub-state S3ay, an aperture window 258 during the sub-state S3ay, a hold-off period 254 during the sub-state S3by, and an aperture window 260 during the sub-state S3by. In the example, the hold-off periods 252 and 254, and the aperture windows 258 and 260 are stored in the memory device 116 for access by the processor 114. Further, in the example, the user provides commands to the processor 114 to not tune the frequency of the HF RF generator 104 during the hold-off periods 252 and 254 and to tune the frequency during the aperture windows 258 and 260. To illustrate, the user provides a time period for the hold-off period 252 via the input device to the processor 114. In the illustration, upon receiving the time period, the processor 114 identifies the hold-off period 252 and calculates a time period for the aperture window 258 by subtracting the time period for the hold-off period 252 from the time period of the first duty cycle. Also, in the example, there is no frequency tuning during the hold-off period. Further, in the example, a time period between the time t22 and t23 during which the transition state S23y occurs is the hold-off period 252. In the example, a time period during which frequency tuning is not applied is referred to herein as a hold-off period and a time period during which the frequency tuning is applied is referred to herein as an aperture window. To illustrate, a hold-off period is a time period between two aperture windows of a steady state of an RF signal. To further illustrate, a time interval between the aperture window 258 and the aperture window 260 is the hold-off period 254. In the further illustration, the aperture window 258 overlaps with a portion of the sub-state S3ay and the aperture window 260 overlaps with a portion of the sub-state S3by. In the further illustration, the aperture window 258, which immediately follows the hold-off period 252 is a time period between the times t23 and t24.5. In the further illustration, the aperture window 258 is immediately followed by the hold-off period 254, which is a time period between the time t24.5 and the time t25.5. Also, in the further illustration, the hold-off period 254 is immediately followed by the aperture window 260, which is a time period between the time t25.5 and the time t27. As an example, the frequency tuning is a modification of an HF offset value, which is a frequency value of the RF signal 152, to reduce the reflected power or increase the delivered power that is measured by the P sensor 112 during processing of the substrate S.

In one embodiment, the aperture window 260 has a different, such as a smaller or a larger, time interval than that illustrated in FIG. 2C.

Similarly, in an embodiment, the aperture window 258 has a different, such as a smaller or a larger, time interval than that illustrated in FIG. 2C.

Also, in one embodiment, the hold-off period 252 has a different, such as a smaller or a larger, time interval than that illustrated in FIG. 2C.

In an embodiment, the hold-off period 254 has a different, such as a smaller or a larger, time interval than that illustrated in FIG. 2C.

In one embodiment, the pre-determined number of sub-states is three or four.

Figures 3, 4:
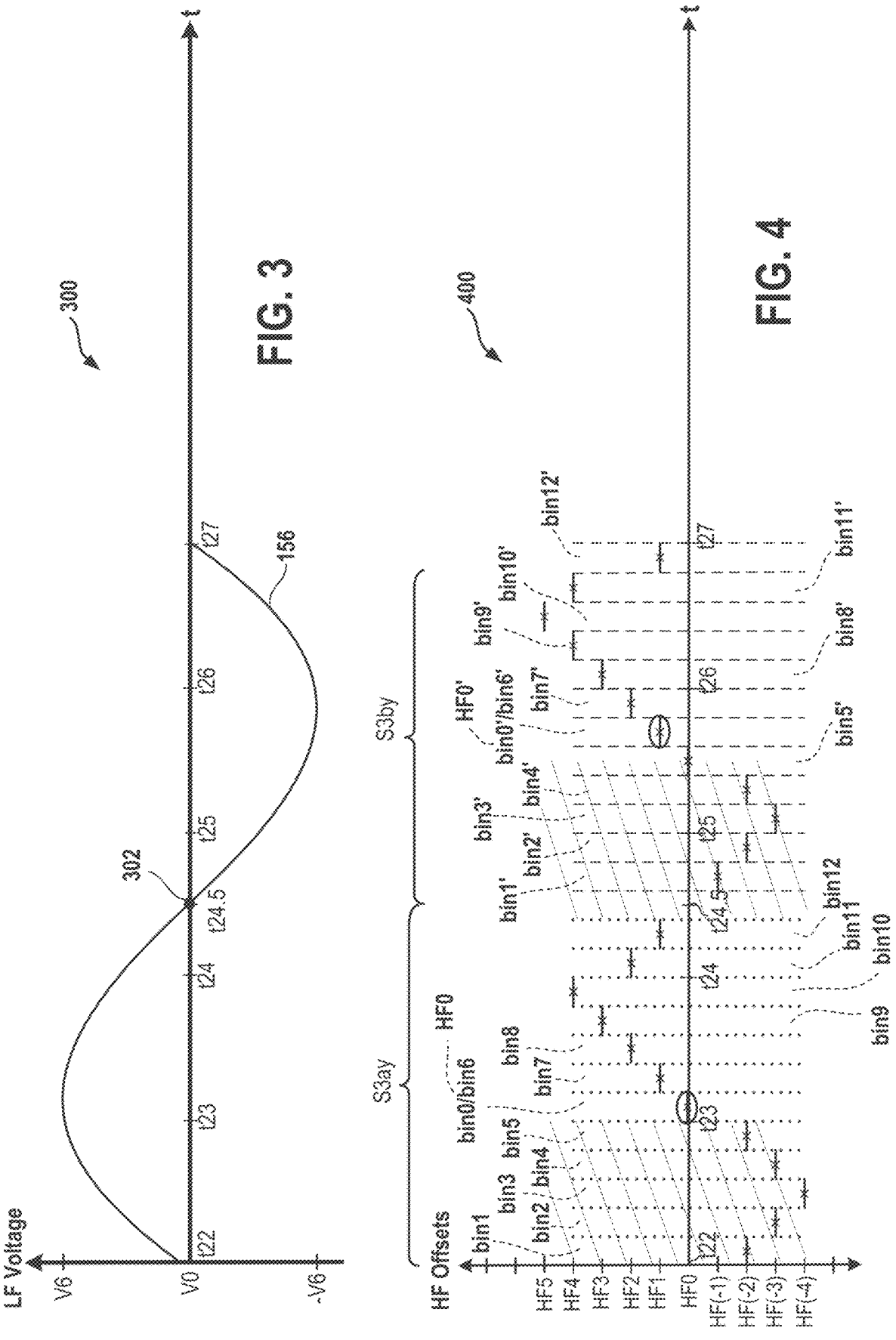
FIG. 3 is a graph to illustrate a voltage signal that is generated by a voltage (V) sensor.
FIG. 4 is a graph to illustrate an embodiment of the method for reducing a power glitch.

FIG. 3 is a diagram of an embodiment of a graph 300 to illustrate the voltage signal 156 that is generated by the V sensor 110 (FIG. 1). The graph 300 plots voltage values of the voltage signal 156 versus the time t. The voltage values range from −V6 to V0 and from V0 to V6. An example of the voltage value V0 is zero. Another example of the voltage value V0 is a negative voltage value. The voltage values of the graph 300 are plotted on a y-axis and the time t is plotted on an x-axis. A negative crossing 302 occurs at a time t24.5. During the occurrence of the negative crossing 302, the voltage signal 156 has a negative slope and has the voltage value V0. A cycle of the voltage signal 156 occurs for a time period from the time t22 to the time t27, and each cycle of the voltage signal 156 occurs thereafter to repeat periodically for an equal amount of the time period.

FIG. 4 is a graph 400 to illustrate the method for reducing the power glitch. The graph 400 plots HF offset values of the RF signal 152 versus the time t. The HF offset values are plotted on a y-axis and the time t is plotted on an x-axis. The HF offset values of the graph 400 ranges from HF(−4) to HF0 and from HF0 to HF5.

The processor 114 determines to divide the transition state S23y and the state S3y into the sub-states S3ay and S3by, and during each of the sub-states S3ay and S3by, a different reference high frequency value and HF offset values from the reference high frequency value are applied. For example, the processor 114 divides the first duty cycle, which is the time period for an occurrence of the sub-state S3ay, into a first pre-determined number of bins, such as the bin 1 and bins 2 through 12. In the example, each of the bins 1 through 12 has the same time interval. To illustrate, a time interval of the bin 1 is equal to a time interval of the bin 2. In the example, the bin 6 is also referred to herein as the bin 0. Continuing with the example, the processor 114 generates and sends, within the recipe signal 144 (FIG. 1), the information regarding the sub-state S3ay, which includes a time interval of the bin 0, and an instruction to apply the reference high frequency value HF0 during the bin 0 of the sub-state S3ay of each cycle n, (n+1), and so on. Moreover, the processor 114 further generates and sends, within the recipe signal 144, the information regarding the sub-state S3ay, which includes a time interval of each of the bins 1 through 5 and 7 through 12, and an instruction to apply the first set of HF offset values from the reference high frequency value HF0 during the bins 1 through 5 and 7 through 12 of the sub-state S3ay of each cycle n, (n+1), and so on. To illustrate, the processor 114 includes within the instructions that the HF RF generator 104 is to generate the RF signal 152 having the HF offset HF(−2) during the bin 1, the HF offset HF(−3) during the bin 2, and so on until the HF offset HF1 during the bin 12.

Moreover, continuing with the example, the processor 114 divides the second duty cycle, which is the time period for an occurrence of the sub-state S3by, into a second pre-determined number of bins, such as the bin 1' and bins 2' through 12'. As an illustration, the first pre-determined number of bins is equal to the second pre-determined number of bins. As another illustration, the first pre-determined number of bins is greater than or less than the second pre-determined number of bins. In the example, each of the bins 1' through 12' has the same time interval. To illustrate, a time interval of the bin 1' is equal to a time interval of the bin 2'. In the example, the bin 6' is also referred to herein as the bin 0'. Continuing with the example, the processor 114 generates and sends, within the recipe signal 144, the information regarding the sub-state S3by, which includes a time interval of the bin 0', and an instruction to apply the reference high frequency value HF0' during the bin 0' of the sub-state S3by of each cycle n, (n+1), and so on. Moreover, the processor 114 further generates and sends, within the recipe signal 144, the information regarding the sub-state S3by, which includes a time interval of each of the bins 1' through 5' and 7' through 12', and an instruction to apply HF offset values from the reference high frequency value HF0' during the bins 1' through 5' and 7' through 12' of the sub-state S3by of each cycle n, (n+1), and so on. To illustrate, the processor 114 includes within the instructions that the HF RF generator 104 is to generate the RF signal 152 having the HF offset HF(−1) during the bin 1', the HF offset HF(−2) during the bin 2' and so on until the HF offset HF1 during the bin 12'.

Continuing further with the example, the HF RF generator 104 receives the reference high frequency value HF0, and the instruction to generate the reference high frequency value HF0 during the bin 0, and generates the RF signal 152 having the reference high frequency value HF0 during the time interval of the bin 0 of the cycles n, (n+1) and so on. Moreover, in the example, the HF RF generator 104 receives the instructions to apply the HF offset values for the bins 1 through 5 and 7 through 12 and the time intervals of the bins 1 through 5 and 7 through 12, and generates the RF signal 152 having a respective one of the HF offset values during a respective of the bins 1 through 5 and 7 through 12. To illustrate, the HF RF generator 104 receives the instruction to apply the HF offset HF(−2) during the bin 1 and generates the RF signal 152 having the HF offset (−2) during the bin 1 of the cycles n, (n+1) and so on.

Also, in the example, the HF RF generator 104 receives the reference high frequency value HF0', and the instruction to generate the reference high frequency value HF0' during the bin 0', and generates the RF signal 152 having the reference high frequency value HF0' during the time interval of the bin 0' of the cycles n, (n+1) and so on. Moreover, in the example, the HF RF generator 104' receives the instructions to apply the HF offset values for the bins 1' through 5' and 7' through 12 and the time intervals of the bins 1' through 5' and 7' through 12', and generates the RF signal 152 having a respective one of the HF offset values during a respective of the bins 1' through 5' and 7' through 12'. To illustrate, the HF RF generator 104 receives the instruction to apply the HF offset HF(−1) during the bin 1' and generates the RF signal 152 having the HF offset (−1) during the bin 1'.

In the example, by applying different reference high frequency values and HF offset values based on the reference high frequency values during the sub-states S3ax and S3ay, the power glitch is reduced in an accurate manner. To illustrate, the power reflected towards the HF RF generator 104 is reduced or the power delivered by the HF RF generator 104 is increased during each of the first and second duty cycles.

According to the commands received from the user, the HF offset values applied during a hold-off period are not tuned, such as modified, by the processor 114 during processing of the substrate S. For example, the processor 114 avoids modifying the HF offset values during the hold-off period. In the example, the HF offset values applied during the hold-off period 252 of the cycles n, (n+1) and so on are not modified by the processor 114 based on the power measured by the P sensor 112 (FIG. 1) during the hold-off period 252 of the cycle n. To illustrate, the processor 114 receives values of the power measured from the P sensor 112 during the bins 1 through 5 of the hold-off period 252 of the cycle n of the clock signal 202. In the illustration, the processor 114 stores the values of power in the memory device 116. Further, in the illustration, the processor 114 does not modify the HF offset values to be applied during the bins 1 through 5 of the cycles (n+1) and so on based on the values of power for the bins 1 through 5 of the cycle n. In the illustration, the processor 114 sends, within the recipe signal 144 (FIG. 1), the same HF offset values to be applied during the cycle (n+1) and so on as those applied during the cycle n to the HF RF generator 104. In the illustration, upon receiving the HF offset values, the HF RF generator 104 generates the RF signal 152 having the HF offset values during the hold-off period 252 of the cycles (n+1) and so on. In the illustration, the HF offset values, if modified, reduce the power reflected towards the HF RF generator 104 during the cycle (n+1) and so on. Also, in the illustration, the HF offset values are frequency values of the RF signal 152 to be applied during the bins 1 through 5 of the cycles n, (n+1) and so on, and a correspondence, such as a one-to-one relationship, between each of the HF offset values and a respective one of the bins 1 through 5 of the hold-off period 252 is stored in the memory device 116. In the illustration, the processor 114 applies the HF offset values during the hold-off period 252 of the sub-state S3ay of the cycles n, (n+1) and so on.

As another example, the HF offset values applied during the hold-off period 254 are not modified by the processor 114 based on the power measured by the P sensor 112. To illustrate, the processor 114 receives values of the power measured from the P sensor 112 during the bins 1' through 5' of the hold-off period 254 of the cycle n of the clock signal 202. In the illustration, the processor 114 stores the values of power in the memory device 116. Further, in the illustration, the processor 114 does not modify the HF offset values to be applied during the bins 1' through 5' of the cycles (n+1) and so on based on the values of power for the bins 1' through 5' of the cycle n. In the illustration, the processor 114 sends, within the recipe signal 144 (FIG. 1) the same HF offset values to be applied during the cycles (n+1) and so on as those applied during the cycle n to the HF RF generator 104. In the illustration, upon receiving the HF offset values, the HF RF generator 104 generates the RF signal 152 having the HF offset values during the hold-off period 254 of the cycle (n+1) and so on. In the illustration, the HF offset values, if modified, reduce the power reflected towards the HF RF generator 104. Also, in the illustration, the HF offset values are frequency values of the RF signal 152 to be applied during the bins 1' through 5' of the hold-off period 254 of the cycles n, (n+1) and so on, and a correspondence, such as a one-to-one relationship, between each of the HF offset values and a respective one of the bins 1' through 5' is stored in the memory device 116. In the illustration, the processor 114 applies the HF offset values during the hold-off period 254 of the sub-state S3by of the cycles n, (n+1) and so on.

Moreover, as per the commands received from the user, the HF offset values applied during an aperture window are tuned by the processor 114 during processing of the substrate S. For example, the HF offset values applied during the aperture window 258 are modified by the processor 114 based on the power measured by the P sensor 112. To illustrate, the processor 114 receives values of the power measured from the P sensor 112 during the bins 7 through 12 of the aperture window 258 of the cycle n of the clock signal 202. In the illustration, the processor 114 stores the values of power in the memory device 116. Further, in the illustration, the processor 114 modifies the HF offset values to be applied during the bins 7 through 12 of the cycles (n+1) and so on based on the values of power for the bins 7 through 12 of the cycle n. In the illustration, the processor 114 sends, within the recipe signal 144 (FIG. 1), the modified HF offset values to be applied during the cycles (n+1) and so on to the HF RF generator 104. In the illustration, upon receiving the HF offset values, the HF RF generator 104 generates the RF signal 152 having the modified HF offset values during the aperture window 258 of the cycle (n+1) and so on. In the illustration, the HF offset values, if modified, reduce the power reflected towards the HF RF generator 104. Also, in the illustration, the HF offset values are frequency values of the RF signal 152 to be applied during the bins 7 through 12 of the aperture window 258 of the cycles (n+1) and so on, and a correspondence, such as a one-to-one relationship, between each of the HF offset values and a respective one of the bins 7 through 12 is stored in the memory device 116. In the illustration, the processor 114 applies the modified HF offset values during the aperture window 258 of the sub-state S3ay of the cycles (n+1) and so on.

As another example, the HF offset values applied during the aperture window 260 are modified by the processor 114 based on the power measured by the P sensor 112. To illustrate, the processor 114 receives values of the power measured from the P sensor 112 during the bins 7' through 12' of the aperture window 260 of the cycle n of the clock signal 202. In the illustration, the processor 114 stores the values of power in the memory device 116. Further, in the illustration, the processor 114 modifies the HF offset values to be applied during the bins 7' through 12' of the cycles (n+1) and so on based on the values of power for the bins 7' through 12' of the cycle n. In the illustration, the processor 114 sends, within the recipe signal 144 (FIG. 1) the modified HF offset values to be applied during the cycles (n+1) and so on to the HF RF generator 104. In the illustration, upon receiving the HF offset values, the HF RF generator 104 generates the RF signal 152 having the modified HF offset values during the aperture window 260 of the cycle (n+1) and so on. In the illustration, the HF offset values, if modified, reduce the power reflected towards the HF RF generator 104. Also, in the illustration, the HF offset values are frequency values of the RF signal 152 to be applied during the bins 7' through 12' of the cycles (n+1) and so on, and a correspondence, such as a one-to-one relationship, between each of the HF offset values and a respective one of the bins 7' through 12' is stored in the memory device 116. In the illustration, the processor 114 applies the HF offset values during the aperture window 260 of the sub-state S3by of the cycles (n+1) and so on.

In one embodiment, the processor 114 applies dynamic frequency tuning (DFT) to determine the reference high frequency value HF0 or HF0' that is stored in the memory device 116. For example, in DFT, the processor 114 determines the high frequency value HF0 or HF0' by rotating a high frequency impedance trajectory on a Smith chart to minimize the power reflected towards the HF RF generator 104.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, a plasma system, described herein, includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHz RF generator, a Y MHz RF generator, and a Z MHz RF generator are coupled to an inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for reducing reflected power associated with a high frequency (HF) radio frequency (RF) generator after a transition state, comprising:
   controlling the HF RF generator to divide a state of an HF RF signal into a plurality of sub-states, wherein the plurality of sub-states include a first sub-state and a second sub-state;
   controlling the HF RF generator to apply a first reference high frequency value during the first sub-state and a second reference high frequency value during the second sub-state;
   applying a first set of HF offset values from the first reference high frequency value during the first sub-state; and
   applying a second set of HF offset values from the second reference high frequency value during the second sub-state.

2. The method of claim 1, wherein the state includes the transition state and a steady state, wherein during the steady state, the HF RF signal has a power level within a pre-determined range, wherein during the transition state, the HF RF signal has a power level outside the pre-determined range.

3. The method of claim 1, wherein said controlling the HF RF generator to divide the state into the plurality of sub-states includes:
   providing a first duty cycle of the first sub-state and a second duty cycle of the second sub-state to the HF RF generator;
   providing a first power level of the HF RF signal to be applied during the first duty cycle;
   providing a second power level of the HF RF signal to be applied during the second duty cycle, wherein the first power level is equal to the second power level.

4. The method of claim 1, further comprising:
   accessing, for each of the plurality of sub-states, a hold-off period and an aperture window; and
   tuning a frequency of the HF RF signal during the aperture window.

5. The method of claim 4, further comprising avoiding tuning of the frequency of the HF RF signal during the hold-off period.

6. The method of claim 1, wherein the first reference high frequency value is different from the second reference high frequency value.

7. The method of claim 1, wherein the first sub-state includes the transition state and a first portion of a steady state, and the second sub-state includes a second portion of the steady state.

8. A controller for reducing reflected power associated with a high frequency (HF) radio frequency (RF) generator after a transition state, comprising:
   a processor configured to:
      control the HF RF generator to divide a state of an HF RF signal into a plurality of sub-states, wherein the plurality of sub-states include a first sub-state and a second sub-state;
      control the HF RF generator to apply a first reference high frequency value during the first sub-state and a second reference high frequency value during the second sub-state;
      apply a first set of HF offset values from the first reference high frequency value during the first sub-state; and
      apply a second set of HF offset values from the second reference high frequency value during the second sub-state; and
   a memory device coupled to the processor.

9. The controller of claim 8, wherein the state includes the transition state and a steady state, wherein during the steady state, the HF RF signal has a power level within a pre-determined range, wherein during the transition state, the HF RF signal has a power level outside the pre-determined range.

10. The controller of claim 8, wherein to control the HF RF generator to divide the state into the plurality of sub-states, the processor is configured to:
   provide a first duty cycle of the first sub-state and a second duty cycle of the second sub-state to the HF RF generator;
   provide a first power level of the HF RF signal to be applied during the first duty cycle;
   provide a second power level of the HF RF signal to be applied during the second duty cycle, wherein the first power level is equal to the second power level.

11. The controller of claim 8, wherein the processor is configured to:

access, for each of the plurality of sub-states, a hold-off period and an aperture window; and tune a frequency of the HF RF signal during the aperture window.

12. The controller of claim 11, wherein the processor is configured to avoid tuning of the frequency of the HF RF signal during the hold-off period.

13. The controller of claim 8, wherein the first reference high frequency value is different from the second reference high frequency value.

14. The controller of claim 8, wherein the first sub-state includes the transition state and a first portion of a steady state, and the second sub-state includes a second portion of the steady state.

* * * * *